(12) United States Patent
Brodsky

(10) Patent No.: US 6,407,924 B1
(45) Date of Patent: Jun. 18, 2002

(54) ENHANCED THERMAL PATH MECHANICAL TOLERANCE SYSTEM

(75) Inventor: William L. Brodsky, Binghamton, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/757,002

(22) Filed: Jan. 9, 2001

(51) Int. Cl.[7] .................................................. H05K 7/20
(52) U.S. Cl. ..................... 361/704; 361/707; 361/709; 361/710; 361/718; 361/719; 257/706; 257/717; 257/718; 257/719; 165/80.2; 165/80.3; 165/185
(58) Field of Search ................................. 361/702–704, 361/707, 715–720; 257/718, 719, 726, 727; 174/16.1, 16.3; 165/80.2, 80.3, 185

(56) References Cited

U.S. PATENT DOCUMENTS

| | | | |
|---|---|---|---|
| 3,619,473 A | * | 11/1971 | Meyerhoff et al. .......... 174/16.3 |
| 3,789,248 A | * | 1/1974 | Jaecklin et al. ............. 310/355 |
| 4,235,283 A | | 11/1980 | Gupta |
| 4,323,914 A | | 4/1982 | Berndlmaier et al. |
| 4,345,267 A | | 8/1982 | Corman et al. |
| 5,528,462 A | * | 6/1996 | Pendse ........................ 361/767 |
| 5,731,955 A | | 3/1998 | Bartanen et al. |
| 5,735,340 A | * | 4/1998 | Mira et al. .................. 165/80.3 |
| 5,814,536 A | | 9/1998 | Rostoker et al. |
| 5,869,891 A | | 2/1999 | Rostoker et al. |
| 5,903,436 A | * | 5/1999 | Brownell et al. ........... 361/704 |
| 5,926,371 A | * | 7/1999 | Dolbear ...................... 361/704 |
| 6,081,426 A | | 6/2000 | Takeda et al. |
| 6,088,228 A | | 7/2000 | Petersen et al. |

* cited by examiner

Primary Examiner—Boris Chervinsky
(74) Attorney, Agent, or Firm—Schmeiser, Olsen & Watts; LawrenceR. Fraley

(57) ABSTRACT

A method and structure for interfacing a thermally conductive pad between a heat generating module and a heatsink, such that the pad is in substantial thermal contact with both the module and the heatsink despite the fact that both the module and the heatsink are under mechanical tension. The mechanical tension causes deflection of a surface of the module and a surface of the heatsink so as to generate an air gap between the pad and the heatsink, as well as between the pad and the module. The present invention overcomes the deflection by crowning the pad, crowning the heatsink, or crowning the module.

31 Claims, 6 Drawing Sheets

ENHANCED THERMAL PATH MECHANICAL TOLERANCE SYSTEM

BACKGROUND OF THE INVENTION

1. Technical Field

The present invention relates to a method and structure for maintaining a continuous thermally conductive path between a heat-generating module and a heatsink when both the module and the heatsink are under mechanical tension.

2. Related Art

An electronic package may comprise a chip-containing module that is coupled to a heatsink by an interfacing thermal pad such that both the module and the heatsink are under tension by a mechanical structure of the electronic package. If the tension deflects the module and the heatsink away from the thermal pad, then a thermally conductive path between the module and the heatsink will be severed and heat generated by the chip will not be effectively dissipated. As a consequence, the chip would overheat and have degraded performance or suffer damage.

For a chip subject to the mechanical structure of an electronic package, there is a need to effectively dissipate the heat that the chip generates.

SUMMARY OF THE INVENTION

The present invention provides a structure, comprising:

a heatsink under a first tension, said first tension causing a deflection of a surface of the heatsink, said surface of the heatsink having a first shape when the heatsink is not under said first tension and a second shape when the heatsink is under said first tension;

a module under a second tension, said second tension causing a deflection of a surface of the module, said surface of the module having a first shape when the module is not under said second tension and a second shape when the module is under said second tension; and a thermally conductive pad having: a first surface in substantial thermal contact with the surface of the heatsink, and a second surface in substantial thermal contact with the surface of the module.

The present invention provides a method of forming a structure, comprising:

providing a module having a surface of a first shape, a heatsink having a surface of a first shape, and a thermally conductive pad;

disposing the thermally conductive pad between the module and the heatsink, wherein a first surface of the thermally conductive pad is in contact with the surface of the heatsink, and wherein a second surface of the thermally conductive pad is in contact with the surface of the module;

subjecting the heatsink to a first tension, said first tension deflecting the surface of the heatsink, said surface of the heatsink having a second shape under said first tension, said surface of the heatsink in substantial thermal contact with said first surface of the thermally conductive pad; and subjecting the module to a second tension, said second tension deflecting the surface of the module, said surface of the module having a second shape under said second tension, said surface of the module in substantial thermal contact with said second surface of the thermally conductive pad.

For a chip subject to the mechanical structure of an electronic package, the present invention provides a method and structure for effectively dissipating the heat that the chip generates.

DETAILED DESCRIPTION OF THE INVENTION

Figure 1:
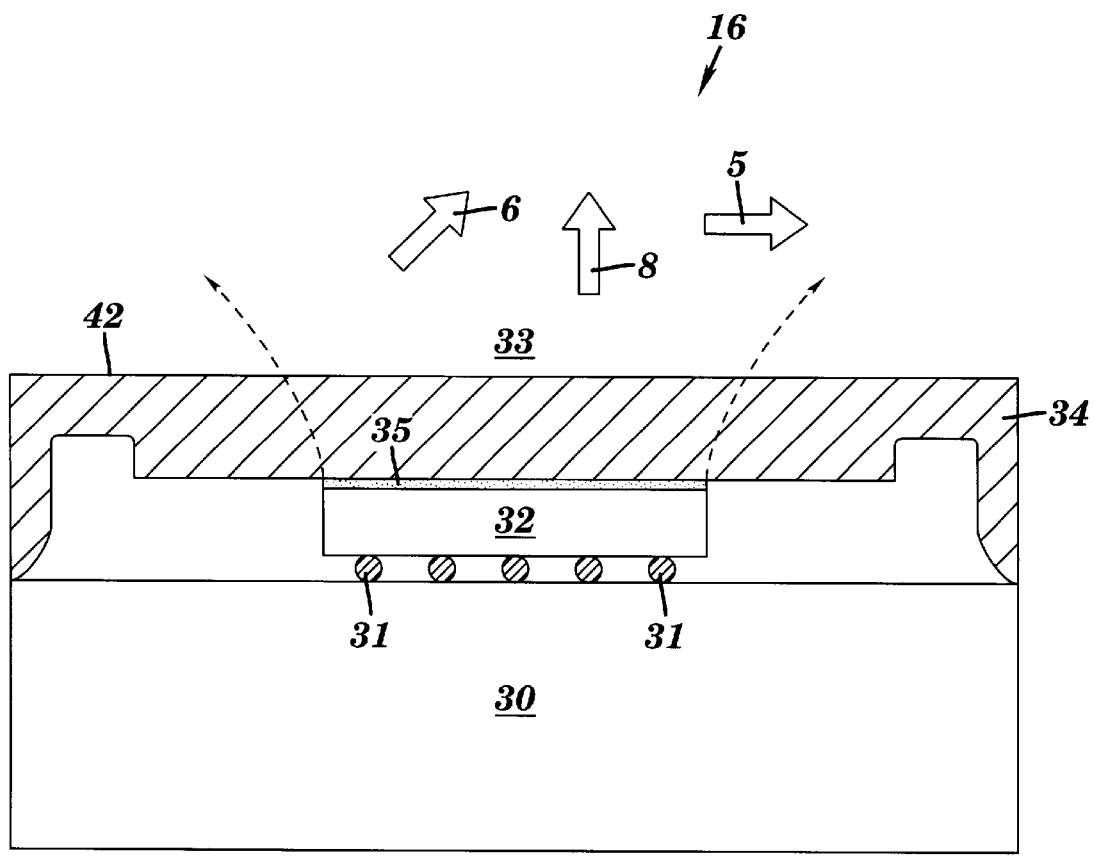
FIG. 1 depicts a front cross-sectional view of a module that includes a semiconductor chip, in accordance with embodiments of the present invention.

FIG. 1 illustrates a front cross-sectional view of a module 16 that includes a semiconductor chip 32 on a substrate 30, in accordance with embodiments of the present invention. The substrate may include, inter alia, a chip carrier such as a ceramic chip carrier or an organic chip carrier. While FIG. 1 shows one chip, namely the chip 32, the module 16 may alternatively include a plurality of chips. The chip (or chips) 32 is located centrally, with respect to directions 5 and 6, within the module 16 and is electrically connected to the substrate 30 by a grid of solder connections 31 as is known in the art. When in operation, the chip 32 generates heat and such heat must be effectively dissipated. Thus, the chip 32 may be viewed as a thermal source. A module cap 34 is thermally conductive and constitutes a module 16 interface which facilitates heat dissipation from the chip 32. Heat generated by the chip 32 is conducted in a direction 8 through a chip-to-cap thermal interface 35 and then through the module cap 34 to a top surface 42 of the module 16 (or of the module cap 34). The module cap 34 may include such thermally conductive materials as, inter alia, copper, aluminum, etc.

Note that the directions 5, 6, and 8 shown in FIG. 1 are mutually orthogonal. The direction 8 is normal to the top surface 42 of the module 16. The directions 5 and 6 are radial directions which are perpendicular to each other and which collectively define a plane that is normal to the direction 8.

Figure 2:
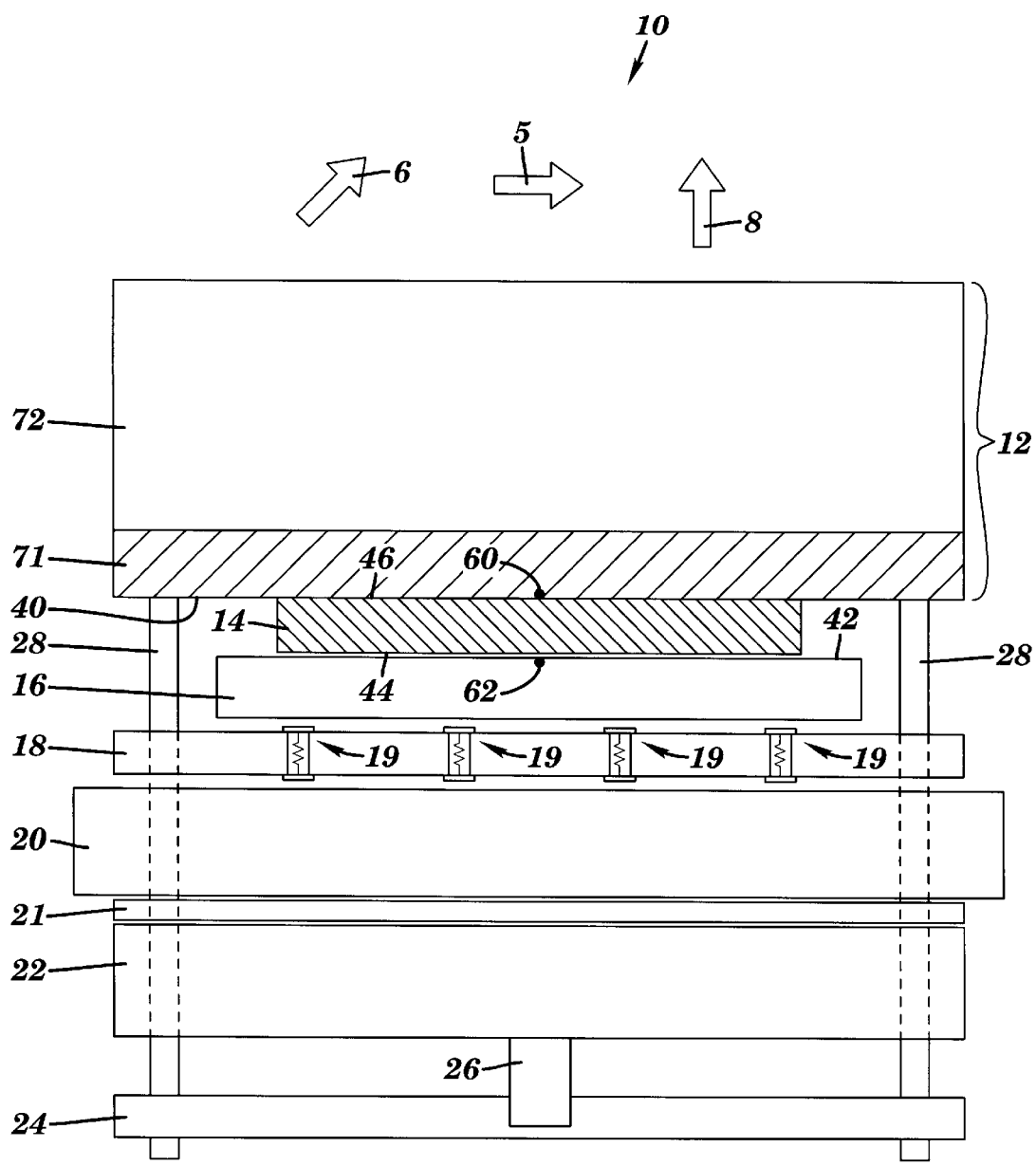
FIG. 2 depicts a front cross-sectional view of a structure comprising the module of FIG. 1 coupled to a heatsink by an interfacing thermal pad, in accordance with embodiments of the present invention.

FIG. 2 illustrates a front cross-sectional view of a structure 10 comprising the module 16 of FIG. 1 coupled to a heatsink 12 by an interfacing thermally conductive pad or interface ("thermal pad") 14, in accordance with embodiments of the present invention. Although the structural details of the module 16 (e.g., the substrate 30, the chip, 32, and the module cap 34) as shown in FIG. 1 do not appear in FIG. 2, such structural details are nevertheless present in the module 16 and have been omitted in FIG. 2 for simplicity of presentation.

The heatsink 12 comprises a base portion 71 and a fin portion 72. The base portion 71 includes a solid volume on which the fin portion 72 rests. The fin portion 72 includes a plurality of fins stacked in the direction 6 each pair of successive fins is spatially separated. The fin structure of the heatsink 12 in FIG. 2 is exemplary. Generally, the heatsink 12 has an active or passive structure (e.g., fins, heat pipes, etc.) which may be of any design that would be known to a person of ordinary skill in the art.

The heatsink 12 may include such thermally conductive materials as, inter alia, copper, aluminum, etc. The thermal pad 14 may include such thermally conductive materials as, inter alia, aluminum oxide, PolyAlphaOlephine (PAO) oil, and diamond particles. A thermal path for dissipation of heat from the chip 32 (see FIG. 1) of the module 16 includes: the chip 32, the chip-to-cap thermal interface 35, a radially central portion of the module cap 34 (see FIG. 1), a radially central portion the thermal pad 14, and a radially central portion the heatsink 12. Radially central portions of the module cap 34, the thermal pad 14, and the heatsink 12 are those portion above the chip (or chips) 32 described by the space 33 shown in FIG. 1. The radially central portion increases (i.e., widens as shown by the space 33) in the direction 8 as the thermal energy approaches the heatsink 12 and propagates into the heatsink 12.

FIG. 2 also shows an interposer 18, a printed wiring board (PWB) 20, an electrical insulator 21, a stiffener 22, a spring plate 24, an actuation screw 26, and a plurality of heatsink posts 28. The interposer 18 is disposed between the module 16 and the PWB 20, and the interposer 18 provides a signal path between the module 16 and the PWB 20. The stiffener 22 is coupled to the PWB 20 as shown. The actuation screw 26 couples the spring plate 24 to the stiffener 22. The plurality of posts 28 couple the heatsink 12 to the spring plate 24. The electrical insulator 21 serves to insulate plated through holes, lands, and circuits on the PWB 20 from shorting with the stiffener 22.

Figure 3:
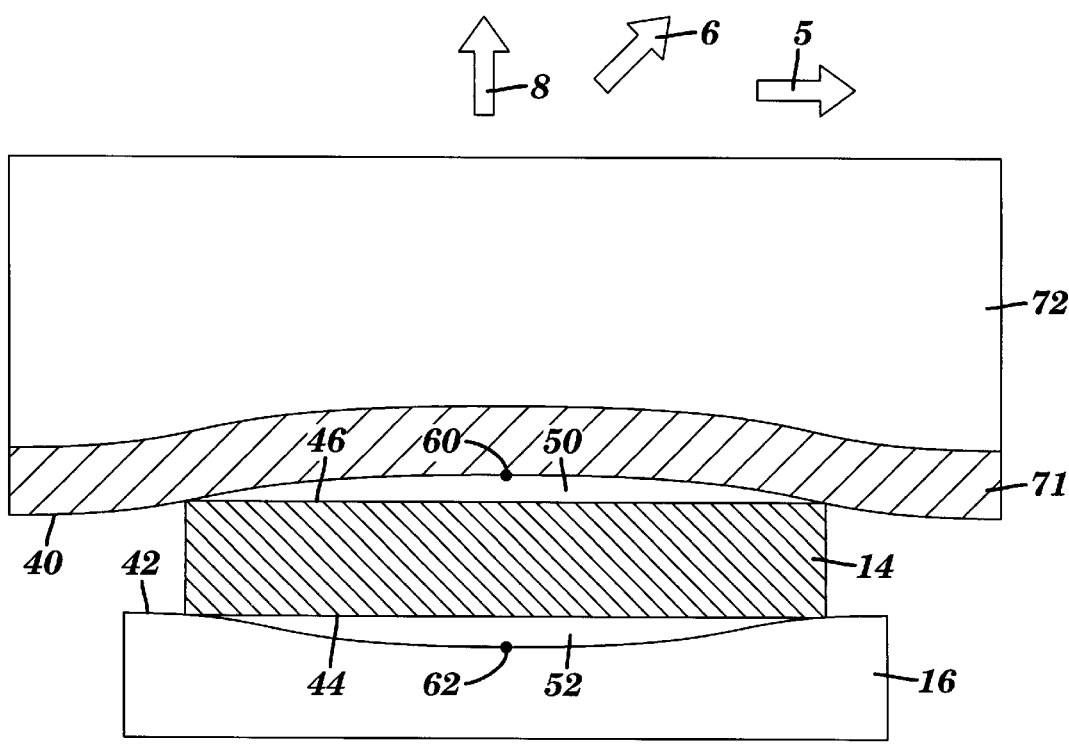
FIG. 3 depict FIG. 2, showing deflection of the module and heatsink due to mechanical tension on the module and heatsink.

The interposer 18 includes a plurality of springs contacts 19 oriented in the direction 8. In some applications the plurality of spring contacts 19 include about 800 to at least about 5000 spring contacts. The spring contacts 19 are subject to a compressive force because the heatsink posts 28 are under tension, which results in a clamping force on the interposer 18 from the heatsink 12 and the spring plate 24. The compressive force on each spring contact 19 in the interposer 18 is application dependent and depends on the mechanical coupling details within the structure 10. A representative, but not comprehensive, range of compressive force on each spring contact 19 is about 0.15 pounds to about 0.25 pounds. Thus, a composite compressive force on an interposer of 800 springs is about 120 pounds to about 200 pounds, while a composite compressive force on an interposer of 5000 springs is about 750 pounds to about 1250 pounds. 12, the force is transmitted through the heatsink posts 28 to the spring plate 24. Then the force is transmitted along the spring plate 24 to the actuation screw 26 and back to the stiffener 20. The force ("actuation load") is also transmitted to the thermal pad 14 and is concentrated around the periphery of the thermal pad 14, causing both the heatsink 12 and the module 16 be under tension and to bow as shown in FIG. 3. Such bowing causes a surface 40 of the heatsink 12 and a surface 42 of the module 16 to each deflect (i.e., deviate from planarity). The surface 40 of the heatsink 12 is deflected in a direction that is normal to the surface 40, and the surface 42 of the module 16 is deflected in a direction that is normal to the surface 42. The deflection of the surface 40 of the heatsink 12 tends to be largest at a central point 60 of the surface 40 and to decrease with increasing radial distance (i.e., in a direction 5 or 6) from the central point 60. Similarly, the deflection of the surface 42 of the module 16 tends to be largest at a central point 62 of the surface 42 and to decrease with increasing radial distance (i.e., in a direction 5 or 6) from the central point 62. There is additional deflection or deviation from planarity of the surfaces 40 and 42 due to a non-flatness tolerance of the surface 40 of the heatsink 12 and of the surface 42 of the module 16. The aggregate deflection or deviation from planarity due to non-flatness tolerance and the force on the spring contacts is application dependent and has been determined for a particular application to be between 1.4 mils and 1.8 mils for the heatsink 12 and between 1.0 mils and 1.5 mils for the module 16, and thus between 2.4 mils and 3.3 mils for the heatsink 12 and the module 16 combined. Such deflection or deviation from planarity displaces portions of the thermal pad 14 from the heatsink 12 and the module 16. Additional displacement of the thermal pad 14 is caused by compression of the thermal pad 14 due to the actuation load. Such additional displacement of the thermal pad 14 is application dependent and has been determined to be up to about 2 mils for the particular application mentioned supra. Thus, a total displacement of 4.4 mils and 5.3 mils, or approximately 5 mils, is inferred for the particular application mentioned supra.

It is understood that the finned heatsink 12 has a different bending stiffness in the radial directions 5 and 6. Accordingly, if the finned heatsink 12 is subjected to a force in the direction 8, then the consequent base 71 deformation or deflection would differ in the directions 5 and 6. Such differential deformation would cause a noncircular and potentially elliptical deformation shape having two radial dimensions: one associated with the direction 5 and the other associated with the direction 6. In contrast, a heatsink having an equal bending stiffness in the directions 5 and 6 (e.g., a pinned finned heatsink) would have a circular deformation shape. Thus, the base 71 deformation may have a noncircular deformation shape or a circular deformation shape, depending on whether the heatsink 12 bending stiffness is different or the same in the directions 5 and 6.

The aforementioned displacement or deformation of the heatsink 12 and the module 16 generates an air gap 50 between the between the surface 46 of the thermal pad 14 and the surface 40 of the heatsink 12, and an air gap 52 between the surface 44 of the thermal pad 14 and the surface 42 of the module 16. The air gaps 50 and 52 are thermally insulative in comparison with the thermal resistance of the remaining thermal path described supra in conjunction with FIG. 1. Accordingly, the air gaps 50 and 52 substantially degrade the path of heat transfer from module 16 to the heatsink 12, and thus place the chip 32 (see FIG. 1) in the module 16 at risk for overheating. If the chip 32 overheats, then the chip 32 will probably be damaged, destroyed, or suffer degraded performance.

If the surface 46 of the thermal pad 14 and the surface 40 of the heatsink 12 were to be in substantial thermal contact when the heatsink 12 is under a tension that causes the heatsink 12 to bow such as is shown in FIG. 3, then the adverse effect of the air gap 50 on heat transfer from the chip 32 (see FIG. 1) would be eliminated or substantially reduced. Similarly if the surface 44 of the thermal pad 14 and the surface 42 of the module 16 were to be in substantial thermal contact when the module 16 is under a tension that causes the module 16 to bow such as is shown in FIG. 3, then the adverse effect of the air gap 52 on heat transfer from the chip 32 (see FIG. 1) would be eliminated or substantially reduced. Ideally the air gaps 50 and 52 would be eliminated if the thermal pad 14 and the heatsink 12, as well as the thermal pad 14 and the module 16, were in perfect thermal contact.

The present invention provides a structure and method for maintaining substantial thermal contact between the surface 46 of the thermal pad 14 and the surface 40 of the heatsink 12, and between the surface 44 of the thermal pad 14 and the surface 42 of the module 16, when the heatsink 12 is under a tension that causes the heatsink 12 to bow such as is shown in FIG. 3. Let a first surface denote either the surface 46 or the surface 44 of the thermal pad 14. Let a second surface denote either the surface 40 of the heatsink 12 or the surface 42 of the module 16. Definitionally, the first surface and the second surface are in substantial thermal contact if $A_1/A_0$ is at least about 80%. $A_0$ is a thermal contact surface area between the first surface and the second surface when the first surface and the second surface are in perfect thermal contact. $A_1$ is a thermal contact surface area between the first surface and the second surface when the first surface and the second surface are in substantial thermal contact. The thermal contact surface area between the first surface and the second surface is the contact surface area between the first surface and the second surface directly above the chip (or chips) 32 (see FIG. 1) or heat source. Directly above the chip (or chips) 32 is illustrated by the space 33 as projected upward in the direction 8 in FIG. 1. Restricting the definitions of $A_0$ and $A_1$ to contact surface area directly above the chip (or chips) 32 takes into account the fact that the primary path of heat transfer from the chip (or chips) 32 is upward directly above the chip (or chips) 32 in the direction 8 and that heat transfer from the chip (or chips) 32 in directions peripheral to the chip (or chips) 32 (i.e., in directions 5 and 6 in FIG. 1) is comparatively negligible. With perfect thermal contact, there is no air gap between the first surface and the second surface. With substantial thermal contact, there may be one or more air gaps between the first surface and the second surface wherein said air gaps are sufficiently small (and thus the contact surface area is sufficiently large) that the aforementioned lower limit on $A_1/A_0$ is satisfied. If the first surface and the second surface are in substantial thermal contact, then the shape of the first surface is said to be substantially complementary to the shape of the second surface, and vice versa.

Figure 8:
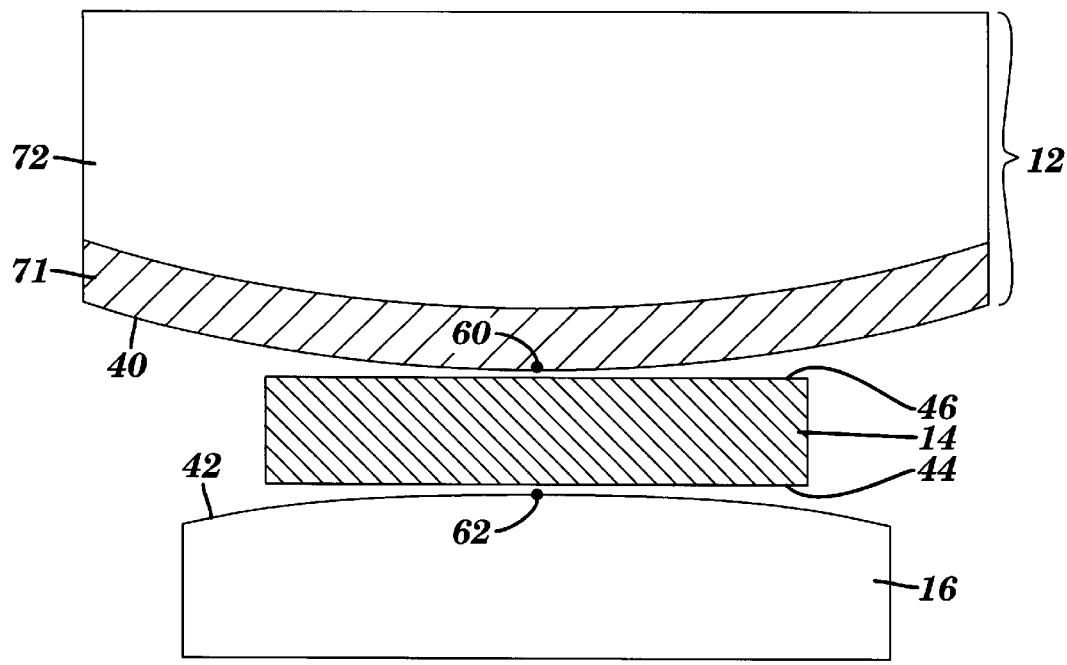
FIG. 8 depicts FIG. 2, showing crowning of a surface of the module and of a surface of the heatsink before the module and heatsink are put under mechanical tension, in accordance with embodiments of the present invention.
Figure 9:
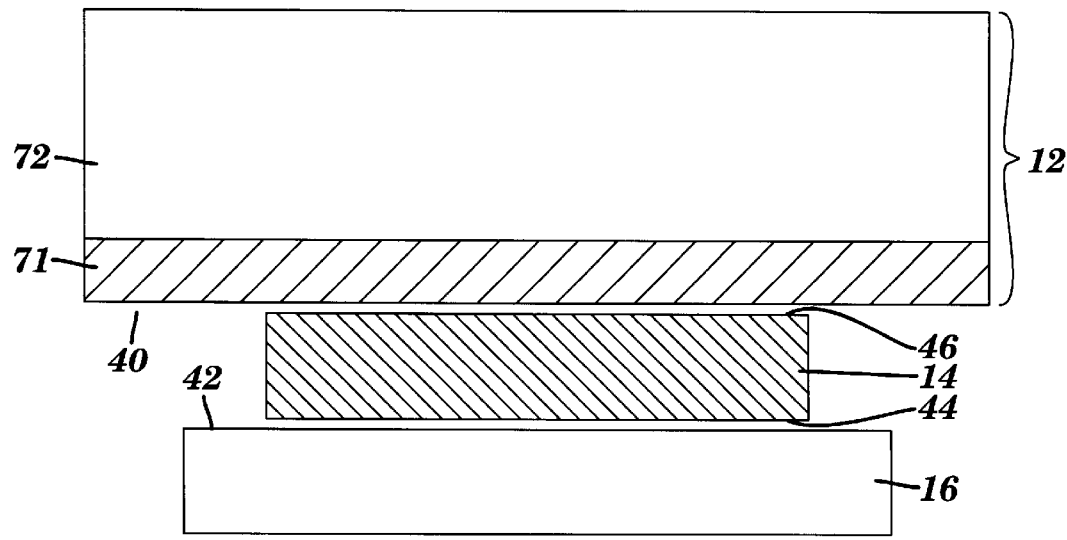
FIG. 9 depicts FIG. 8 while the module and the heatsink are under mechanical tension.

The present invention discloses embodiments for maintaining substantial thermal contact between the surface 46 of the thermal pad 14 and the surface 40 of the heatsink 12 when the heatsink 12 is under a tension that causes the heatsink 12 to bow. The present invention also discloses embodiments for maintaining substantial thermal contact between the surface 44 of the thermal pad 14 and the surface 42 of the module 16 when the module 16 is under a tension that causes the module 16. FIGS. 4–7 illustrate such embodiments relating to crowning one or both of the surfaces 46 and 44 of the thermal pad 14. FIGS. 8–9 illustrate such embodiments relating to crowning one or both of the surface 60 of the heatsink 12 and the surface 62 of the module 16.

Crowning a surface is defined herein as generating a non-planar, curved surface such as by, inter alia, transforming a planar surface into a curved surface or generating a curved surface directly. For example, crowning may cause a surface to have a non-planar shape that is, inter alia, convex, concave, spherical, etc. Definitionally, crowning is not restricted to any particular non-planar shape.

Figure 4:
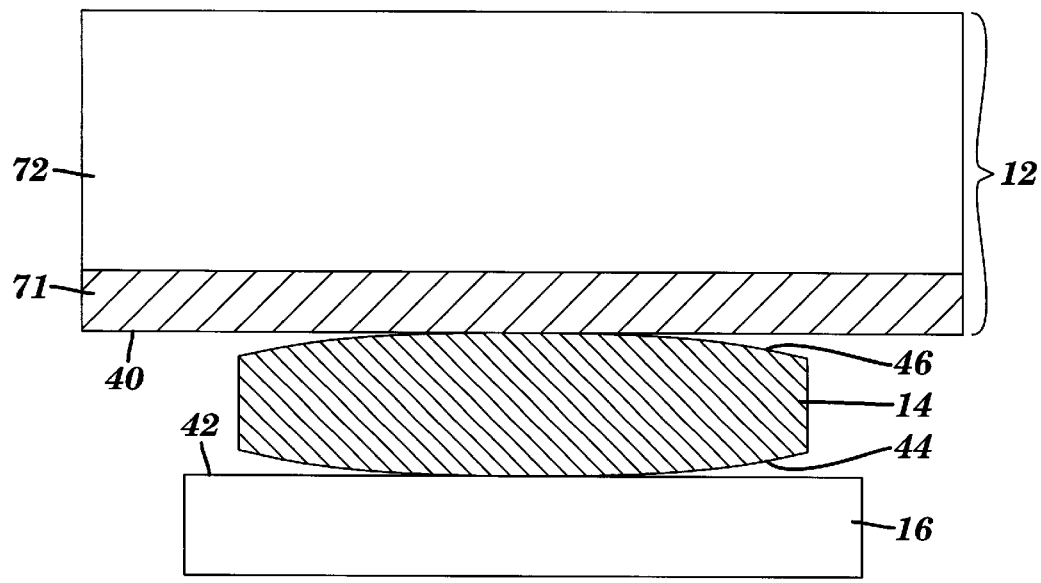
FIG. 4 depicts FIG. 2, showing crowning of upper and lower surfaces of the thermal pad before the module and heatsink are put under mechanical tension, in accordance with embodiments of the present invention.

FIG. 4 illustrates FIG. 2, showing crowning of the surfaces 46 and 44 of the thermal pad 14 before the heatsink 12 and the module 16 are put under mechanical tension, in accordance with embodiments of the present invention. In FIG. 4, the surface 40 of the heatsink 12 is planar, and the surface 42 of the module 16 is planar.

Figure 5:
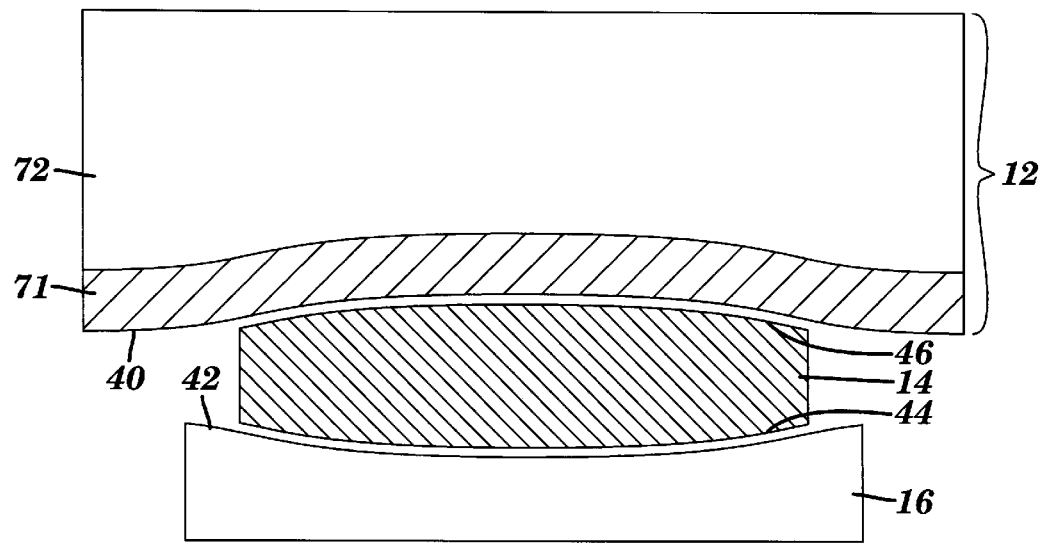
FIG. 5 depicts FIG. 4 while the module and heatsink are under mechanical tension.

FIG. 5 illustrates FIG. 4 while the heatsink 12 and the module 16 are under mechanical tension. In FIG. 5, the surface 46 of the thermal pad 14 is in substantial thermal contact with surface 40 of the heatsink 12, and the surface 44 of the thermal pad 14 is in substantial thermal contact with surface 42 of the module 16. Thus the surface 46 of the thermal pad 14, as crowned, is substantially complimentary to the surface 40 of the heatsink 12 while the heatsink 12 and the module 16 are under mechanical tension. Similarly, the surface 44 of the thermal pad 14, as crowned, is substantially complimentary to the surface 42 of the module 16 while the heatsink 12 and the module 16 are under mechanical tension. Since the surface 46 of the thermal pad 14 is in substantial thermal contact with surface 40 of the heatsink 12, and since the surface 44 of the thermal pad 14 is in substantial thermal contact with surface 42 of the module 16, there is an effective path of conductive heat transfer from the chip (or chips) 32 (see FIG. 1) to the module cap 34 (see FIG. 1), to the thermal pad 14, and to the heatsink 16.

Figure 6:
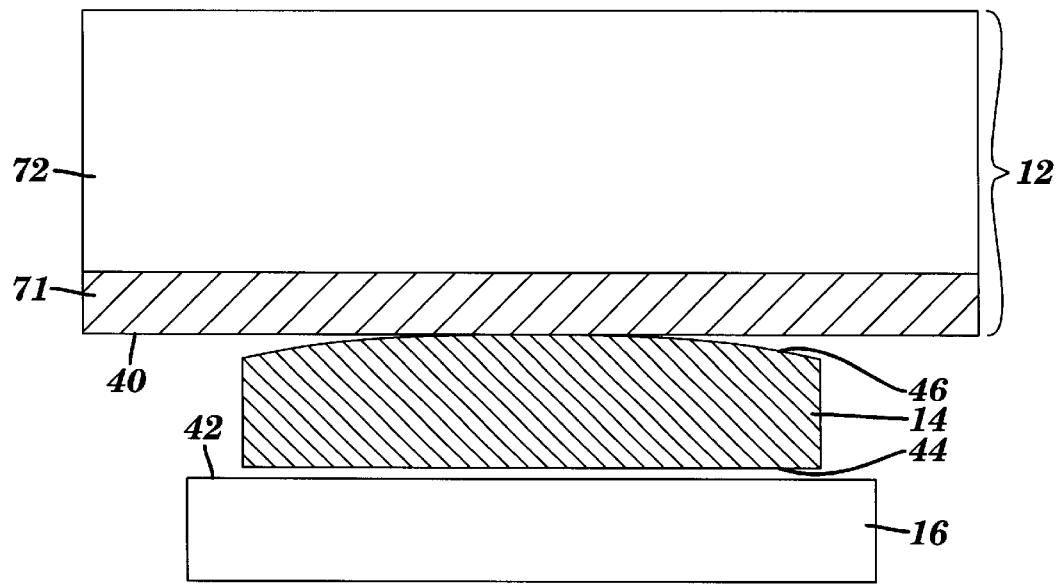
FIG. 6 depicts FIG. 2, showing crowning of the upper surface of the thermal pad before the module and heatsink are put under mechanical tension, in accordance with embodiments of the present invention.

While FIG. 4 shows both surfaces 46 and 44 of the thermal pad 14 as crowned, it is also within the scope of the present invention for either the surface 46 or the surface 44, but not both, to be crowned. For example, FIG. 6 illustrates FIG. 2, showing crowning of the surface 46 of the thermal pad 14 before the module 16 and heatsink 12 are put under mechanical tension, in accordance with embodiments of the present invention. In FIG. 6, the surface 44 of the thermal pad 14 is planar, the surface 40 of the heatsink 12 is planar, and the surface 42 of the module 16 is planar. Because the surface 46 of the thermal pad 14 is crowned, and if the thermal pad 14 has a low modulus (i.e., less than about 1000 lb/in$^2$), then the surface 44 of the thermal pad 14 will take the shape of its mating surface 42 of the module 16 when the heatsink 12 and the module 16 are under mechanical tension. Accordingly, if the module 16 and heatsink 12 of FIG. 6 are put under mechanical tension, then the module 16, thermal pad 14, and heatsink 12 will appear as shown in FIG. 5.

Figure 7:
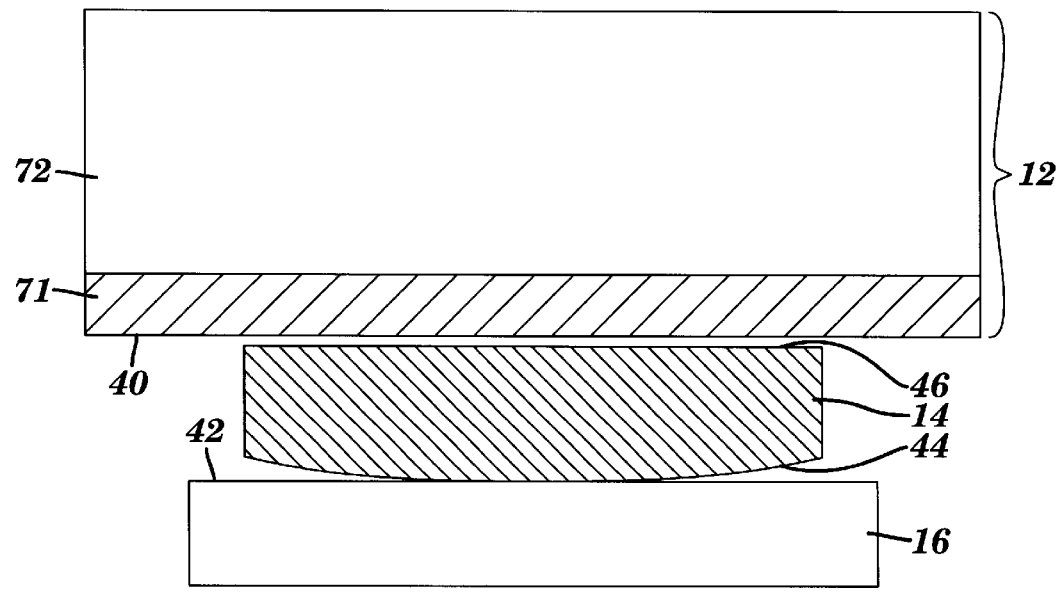
FIG. 7 depicts FIG. 6, showing crowning of the lower surface of the thermal pad before the module and heatsink are put under mechanical tension, in accordance with embodiments of the present invention.

As another example, FIG. 7 illustrates FIG. 2, showing crowning of the surface 44 of the thermal pad 14 before the module 16 and heatsink 12 are put under mechanical tension, in accordance with embodiments of the present invention. In FIG. 7, the surface 46 of the thermal pad 14 is planar, the surface 40 of the heatsink 12 is planar, and the surface 42 of the module 16 is planar. Because the surface 44 of the thermal pad 14 is crowned, and if the thermal pad 14 has a low elastic modulus (i.e., less than about 1000 lb/in$^2$), then the surface 46 of the thermal pad 14 will take the shape of its mating surface 40 of the heatsink 12 when the heatsink 12 and the module 16 are under mechanical tension. Accordingly, if the module 16 and heatsink 12 of FIG. 7 are put under mechanical tension, then the module 16, thermal pad 14, and heatsink 12 will appear as shown in FIG. 5.

FIG. 8 illustrates FIG. 2, showing crowning of the surface 42 of the module 16 and of the surface 40 of the heatsink 12 before the module 16 and heatsink 12 are put under mechanical tension, in accordance with embodiments of the present invention. In FIG. 8, the surfaces 44 and 46 of the thermal pad 14 are each planar.

FIG. 9 illustrates FIG. 8 while the heatsink 12 and the module 16 are under mechanical tension. Due to the relative deflection of points on the surface 42 of the module 16 relative to the central point 62 of the surface 42 as discussed supra in conjunction with FIG. 3, the surface 42 in FIG. 8 straightens out and approaches planarity. Accordingly in FIG. 9, the surface 42 of the module 16 is in substantial thermal contact with the surface 44 of the thermal pad 14. Thus the surface 42 of the module 16, as crowned, is substantially complimentary to the surface 44 of the thermal pad 14 while the heatsink 12 and the module 16 are under mechanical tension.

Similarly, due to the relative deflection of points on the surface 40 of the heatsink 12 relative to the central point 60 of the surface 40 as discussed supra in conjunction with FIG. 3, the surface 40 in FIG. 8 straightens out and approaches planarity. Accordingly in FIG. 9, the surface 40 of the heatsink 12 is in substantial thermal contact with the surface 46 of the thermal pad 14. Thus, the surface 40 of the heatsink 12, as crowned, is substantially complimentary to the surface 46 of the thermal pad 14 while the heatsink 12 and the module 16 are under mechanical tension.

In FIG. 9, since the surface 46 of the thermal pad 14 is in substantial thermal contact with surface 40 of the heatsink 12, and since the surface 44 of the thermal pad 14 is in substantial thermal contact with surface 42 of the module 16, there is an effective path of conductive heat transfer from the chip (or chips) 32 (see FIG. 1) to the module cap 34 (see FIG. 1), to the thermal pad 14, and to the heatsink 16.

Although FIG. 8 shows crowning of both the surface 42 of the module 16 and the surface 40 of the heatsink 12, it is also within the scope of the present invention for either, but not both, of the surfaces 42 and 40 to be crowned as explained in the following two examples. In the first example, if the surface 40 is crowned and the surface 42 is uncrowned, and if the thermal pad 14 has a low elastic modulus (i.e., less than about 1000 lb/in$^2$), then the surface 44 of the thermal pad 14 will take the shape of its mating surface 42 of the module 16 when the heatsink 12 and the module 16 are under mechanical tension. In the second example, if the surface 42 is crowned and the surface 40 is uncrowned, and if the thermal pad 14 has a low elastic modules (i.e., less than about 1000 lb/in$^2$), then the surface 46 of the thermal pad 14 will take the shape of its mating surface 40 of the heatsink 12 when the heatsink 12 and the module 16 are under mechanical tension. Accordingly for both the first example and the second example, if the module 16 and heatsink 12 are put under mechanical tension, then the module 16, thermal pad 14, and heatsink 12 will appear as shown in FIG. 9.

The embodiments of the present invention which have been discussed supra in conjunction with FIGS. 4–9 each involve crowning one or more surfaces. The crowning may be directed to generate any desired shape of the surface or surfaces crowned. A magnitude of crowning is defined as a maximum spatial differential in the direction 8 (see FIG. 3) between points on the crowned surface. The magnitude of crowning may be chosen to be compatible with the total displacement of the thermal pad 14 caused by a combination of actuation load, non-flatness tolerance, and compression of the thermal pad 14 due to the actuation load, as discussed supra. For the particular application discussed supra in which the thermal pad 14 had a total displacement of approximately 5 mils, the magnitude of crowning may be chosen to be about 5 mils.

The crowning of surfaces in accordance with the present invention may be implemented by fabricating a surface of revolution which may serve as a mold for shaping or reshaping a surface to be crowned. The surface of revolution may be formed by using a lathe, such as a Computer Numerical Control (CNC) lathe equipped with a chuck or collet adapted to hold the mating object. The mating object comprises the surface that is to be mated to the surface which will be crowned. For example, if the surface to be crowned is the surface 46 of the thermal pad 14, then the mating object is the heatsink 12 having the surface 40 that is to be mated to the surface 46. Additionally, the crowning of surfaces in accordance with the present invention may be implemented by any method known to one of ordinary skill in the art without undue experimentation.

While embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A structure, comprising:
 a heatsink under a first tension such that a surface of the heatsink is deflected, said surface of the heatsink having a first shape when the heatsink is not under said first tension and a second shape when the heatsink is under said first tension;
 a module under a second tension such that a surface of the module is deflected, said surface of the module having a first shape when the module is not under said second tension and a second shape when the module is under said second tension; and
 a thermally conductive pad having: a first surface in substantial thermal contact with the surface of the heatsink, and a second surface in substantial thermal contact with the surface of the module.

2. The structure of claim 1, wherein the first shape of the surface of the heatsink is substantially planar, and wherein the first surface of the thermally conductive pad has been crowned to have a shape that is substantially complimentary to the second shape of the surface of the heatsink.

3. The structure of claim 2, wherein the first shape of the surface of the module is substantially planar, and wherein the second surface of the thermally conductive pad has been crowned to have a shape that is substantially complimentary to the second shape of the surface of the module.

4. The structure of claim 1, wherein the first shape of the surface of the module is substantially planar, and wherein the second surface of the thermally conductive pad has been crowned to have a shape that is substantially complimentary to the second shape of the surface of the module.

5. The structure of claim 1, wherein the first surface of the thermally conductive pad has a shape that is substantially planar, and wherein the surface of the heatsink has been crowned such that the second shape of the surface of the heatsink is substantially complimentary to the first surface of the thermally conductive pad.

6. The structure of claim 1, wherein the second surface of the thermally conductive pad has a shape that is substantially planar, and wherein the surface of the module has been crowned such that the second shape of the surface of the module is substantially complimentary to the second surface of the thermally conductive pad.

7. The structure of claim 1, wherein the first surface of the thermally conductive pad has a shape that is substantially planar, wherein the surface of the heatsink has been crowned such that the second shape of the surface of the heatsink is substantially complimentary to the first surface of the thermally conductive pad, wherein the second surface of the thermally conductive pad has a shape that is substantially planar, and wherein the surface of the module has been crowned such that the second shape of the surface of the module is substantially complimentary to the second surface of the thermally conductive pad.

8. The structure of claim 1, wherein the module comprises a thermal source in a radially central portion of the module, wherein the thermal source generates heat that is conductively transferred along a path from the thermal source to a radially central portion of the heatsink, and wherein said path passes through a radially central portion of the thermally conductive pad.

9. The structure of claim 8, wherein the thermal source includes at least one semiconductor chip.

10. The structure of claim 8, wherein the thermal source includes at least one semiconductor chip, said structure further comprising:
   a spring plate;
   a stiffener;
   a printed wiring board;
   an actuation screw coupling the spring plate to the stiffener;
   a plurality of posts coupling the heatsink to the spring plate;
   an electrical insulator sandwiched between the stiffener and the printed wiring board; and
   an interposer having a first surface in contact with the printed wiring board, and a second surface in contact with the module, wherein the interposer comprises a plurality of springs.

11. The structure of claim 10, wherein the plurality of springs includes between about 800 springs and about 5000 springs.

12. The structure of claim 10, wherein the plurality of springs are under a compressive force (F), wherein the first tension is a first function of F, and wherein the second tension is a second function of F.

13. The structure of claim 12, wherein F is between about 120 pounds and about 1250 pounds.

14. A method of forming a structure, comprising:
   providing a module having a surface of a first shape, a heatsink having a surface of a first shape, and a thermally conductive pad;
   disposing the thermally conductive pad between the module and the heatsink, wherein a first surface of the thermally conductive pad is in contact with the surface of the heatsink, and wherein a second surface of the thermally conductive pad is in contact with the surface of the module;
   subjecting the heatsink to a first tension, said first tension deflecting the surface of the heatsink, said surface of the heatsink having a second shape under said first tension, said surface of the heatsink in substantial thermal contact with said first surface of the thermally conductive pad; and
   subjecting the module to a second tension, said second tension deflecting the surface of the module, said surface of the module having a second shape under said second tension, said surface of the module in substantial thermal contact with said second surface of the thermally conductive pad.

15. The method of claim 14, wherein the first shape of the surface of the heatsink is substantially planar, and further comprising crowning the first surface of the thermally conductive pad to have a shape that is substantially complimentary to the second shape of the surface of the heatsink.

16. The method of claim 15, wherein the first shape of the surface of the module is substantially planar, and further comprising crowning the second surface of the thermally conductive pad to have a shape that is substantially complimentary to the second shape of the surface of the module.

17. The method of claim 14, wherein the first shape of the surface of the module is substantially planar, and further comprising crowning the second surface of the thermally conductive pad to have has a shape that is substantially complimentary to the second shape of the surface of the module.

18. The method of claim 14, wherein the first surface of the thermally conductive pad has a shape that is substantially planar, and further comprising crowning the surface of the heatsink such that the second shape of the surface of the heatsink is substantially complimentary to the first surface of the thermally conductive pad.

19. The method of claim 14, wherein the second surface of the thermally conductive pad has a shape that is substantially planar, and further comprising crowning the surface of the module such that the second shape of the surface of the module is substantially complimentary to the second surface of the thermally conductive pad.

20. The method of claim 14, wherein the first surface of the thermally conductive pad has a shape that is substantially planar, wherein the second surface of the thermally conductive pad has a shape that is substantially planar, and further comprising:
   crowning the surface of the heatsink such that the second shape of the surface of the heatsink is substantially complimentary to the first surface of the thermally conductive pad; and
   crowning the surface of the module such that the second shape of the surface of the module is substantially complimentary to the second surface of the thermally conductive pad.

21. The method of claim 14, wherein the module comprises a thermal source in a radially central portion of the module, and further comprising activating the thermal source to generate heat that is conductively transferred along a path from the thermal source to a radially central portion of the heatsink wherein said path passes through a radially central portion of the thermally conductive pad.

22. The method of claim 21, wherein the thermal source includes at least one semiconductor chip.

23. The method of claim 21, wherein the thermal source includes at least one semiconductor chip, said method further comprising:
   providing a spring plate, a stiffener, an actuation screw, an electrical insulator, a printed wiring board, a plurality of posts, and an interposer having a plurality of springs;
   disposing the interposer between the module and the printed wiring board such that a first surface of the interposer is in contact with the module and a second surface of the interposer is in contact with the printed wiring board;
   sandwiching the electrical insulator between the stiffener and the printed wiring board;
   coupling the spring plate to the stiffener with the actuation screw; and coupling the heatsink to the spring plate with the plurality of posts.

24. The method of claim 23, wherein the plurality of springs includes between about 800 springs and about 5000 springs.

25. The method of claim 23, wherein the plurality of springs are under a compressive force (F), wherein the first tension is a first function of F, and wherein the second tension is a second function of F.

26. The method of claim 25, wherein F is between about 120 pounds and about 1250 pounds.

27. A structure comprising a thermally conductive pad:
wherein the thermally conductive pad is configured to be mated with a heatsink such that a first surface of the thermally conductive pad is in substantial thermal contact with a surface of the heatsink, said heatsink under a first tension, said first tension causing a deflection of the surface of the heatsink, said surface of the heatsink having a first shape when the heatsink is not under said first tension and a second shape when the heatsink is under said first tension; and
wherein the thermally conductive pad is configured to be mated with a module such that a second surface of the thermally conductive pad is in substantial thermal contact with a surface of the module, said module under a second tension, said second tension causing a deflection of the surface of the module, said surface of the module having a first shape when the module is not under said second tension and a second shape when the module is under said second tension.

28. The structure of claim 27, wherein the first shape of the surface of the heatsink is substantially planar, and wherein the first surface of the thermally conductive pad has been crowned to have a shape that is substantially complimentary to the second shape of the surface of the heatsink.

29. The structure of claim 28, wherein the first shape of the surface of the module is substantially planar, and wherein the second surface of the thermally conductive pad has been crowned to have a shape that is substantially complimentary to the second shape of the surface of the module.

30. The structure of claim 27, wherein the first shape of the surface of the module is substantially planar, and wherein the second surface of the thermally conductive pad has been crowned to have a shape that is substantially complimentary to the second shape of the surface of the module.

31. A structure, comprising:
a heatsink under first tension means for causing a deflection of a surface of the heatsink, said surface of the heatsink having a first shape when the heatsink is not under said first tension means and a second shape when the heatsink is under said first tension means;
a module under second tension means for causing a deflection of a surface of the module, said surface of the module having a first shape when the module is not under said second tension means and a second shape when the module is under said second tension means; and
a thermally conductive pad having: a first surface in substantial thermal contact with the surface of the heatsink, and a second surface in substantial thermal contact with the surface of the module.

* * * * *